United States Patent
Thomas et al.

(10) Patent No.: US 7,425,362 B2
(45) Date of Patent: Sep. 16, 2008

(54) PLASTIC PACKAGING CUSHION

(75) Inventors: James R. Thomas, Austin, TX (US); Clifton C. Haggard, Austin, TX (US); Jason D. Brown, Austin, TX (US); Song Ping Chen, ShenZhen (CN); Ru Zheng Liu, ShenZhen (CN); Michael L. Hayden, Plano, TX (US)

(73) Assignee: e.Pak International, Inc., Austin, TX (US)

( * ) Notice: Subject to any disclaimer, the term of this patent is extended or adjusted under 35 U.S.C. 154(b) by 845 days.

(21) Appl. No.: 10/386,122

(22) Filed: Mar. 11, 2003

(65) Prior Publication Data

US 2004/0048028 A1    Mar. 11, 2004

Related U.S. Application Data

(60) Provisional application No. 60/408,857, filed on Sep. 6, 2002.

(51) Int. Cl.
| B32B 1/00 | (2006.01) |
| B32B 3/00 | (2006.01) |
| B65D 85/00 | (2006.01) |

(52) U.S. Cl. .................. 428/174; 206/701; 206/710
(58) Field of Classification Search .................. 428/174; 206/710, 303, 454, 523
See application file for complete search history.

(56) References Cited

U.S. PATENT DOCUMENTS

| 3,381,076 A | * | 4/1968 | Govatsos ..................... 264/321 |
| 4,053,549 A | * | 10/1977 | Vandor ........................ 264/293 |
| 5,366,079 A | | 11/1994 | Lin et al. |
| 5,875,897 A | * | 3/1999 | Duncan et al. .............. 206/714 |
| 6,193,068 B1 | | 2/2001 | Lewis et al. |
| 6,234,316 B1 | | 5/2001 | Hsieh et al. |
| 6,286,684 B1 | | 9/2001 | Brooks et al. |
| 2002/0144927 A1 | | 10/2002 | Brooks et al. |

FOREIGN PATENT DOCUMENTS

| JP | 744200 | 11/1995 |
| JP | 09129719 | 5/1997 |
| JP | 11135607 | 5/1999 |
| JP | 2000043943 | 2/2000 |
| WO | 0107339 A1 | 2/2001 |

OTHER PUBLICATIONS

Danish Patent & Trademark. Office Search Report.

* cited by examiner

*Primary Examiner*—Patricia L Nordmeyer
(74) *Attorney, Agent, or Firm*—Carlson, Gaskey & Olds

(57) ABSTRACT

A plastic cushion pad (40) includes at least one plastic spring portion (46) between oppositely facing contact surfaces (42, 44). In one example, the pad (40) is vacuum formed using a film of carbon-impregnated polystyrene material. The plastic spring portion (46) is configured to provide the desired amount of resiliency or cushion provided by the pad responsive to a compressive force. In one example, the plastic spring portion is designed to prevent any lateral deformation of the pad when a compressive force is applied.

20 Claims, 3 Drawing Sheets

US 7,425,362 B2

PLASTIC PACKAGING CUSHION

CROSS REFERENCE

This application claims priority to U.S. Provisional Application No. 60/408,857, which was filed on 6 Sep. 2002.

FIELD OF THE INVENTION

This invention generally relates to cushions for packaging items such as semiconductor wafers. More particularly, this invention relates to a plastic cushion member having at least one plastic spring portion to provide a desired cushioning effect between oppositely facing surfaces of the cushion member.

DESCRIPTION OF THE RELEVANT ART

A variety of containers are used for packaging items such as semiconductor wafers. Extreme care must be exercised when handling such packages because of the delicate nature of the wafers within the package. Various approaches have been taken to ensure the integrity of the wafers within the packages during shipping and handling.

One approach has been to include cushions within the package at least at the opposite ends of a stack of the wafers. Typical cushions are made from foam material. Conventional foam cushions provide a cushioning effect, however, they introduce several problems.

One difficulty associated with conventional foam cushions is that they tend to interfere with the material properties of the contents of the semiconductor wafers. This is especially true when the wafers are left in a package with conventional foam cushions over an extended time. The nature of the foam material and nature of the semiconductor materials allows for adverse reactions that compromise the integrity of the semiconductor wafers.

One attempt at modifying foam pads has been to introduce carbon powder into the foam material to reduce the static properties of the foam, for example. A major shortcoming of this approach is that the carbon powder tend to become separated from the foam material. The loose carbon tends to contact and adversely impact the semiconductor wafers.

There is a need for an improved way of cushioning items such as semiconductor wafers within a package so that a desired amount of cushion is provided for shipping and handling purposes. This invention addresses that need while avoiding the shortcomings and drawbacks of the prior art.

SUMMARY OF THE INVENTION

In general terms, this invention is a pad that is made from a plastic material for use in packaging items such as semiconductor wafers.

In one example, the pad comprises a plastic film that is vacuum formed to establish at least one plastic spring portion that resiliently maintains spacing between oppositely facing surfaces of the pad that contact adjacent items.

In one example, multiple contact surfaces are provided on each side of the pad. Plastic spring portions extend between the contact surfaces. The plastic spring portions include surfaces that flex to absorb any force incident on the pad that would tend to compress the pad. In some examples, the plastic spring portions are arranged to limit relative movement between the contact surfaces of the pad so that no lateral deformation of the pad occurs responsive to a compressive force.

In one example, the pad includes a plurality of concentric, circular contact surfaces with plastic spring portions extending between adjacent contact surfaces. A concentric, circular arrangement evenly distributes forces across the entire pad and provides a relatively self-supporting pad having a controlled amount of cushioning affect.

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENTS

Figure 1:
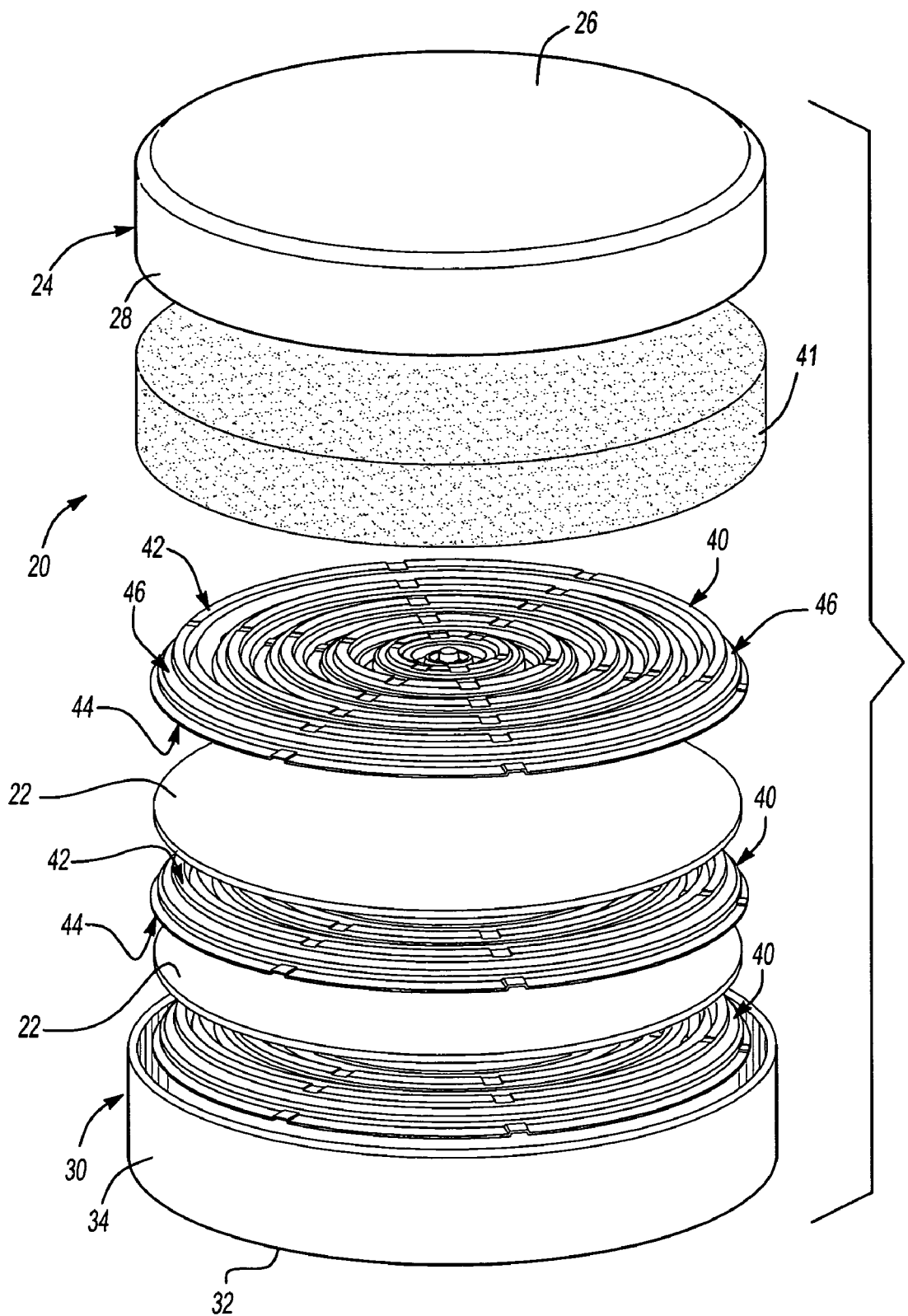
FIG. 1 schematically illustrates a container including cushioning pads designed according to this invention.

FIG. 1 schematically shows a container 20 for packaging items such as semiconductor wafers 22. The container 20 may take a variety of forms and is only schematically shown in FIG. 1. A top 24 of the container 20 has an end wall 26 and a sidewall 28. A bottom 30 of the container has an end wall 32 and a sidewall 34. The top 24 and bottom 30 are secured together in a conventional manner to contain the wafers 22. The sidewalls 28 and 34 cooperate to establish a restraining portion extending between the end walls 26 and 32.

The wafers 22 preferably are stacked within the container 20 with a plurality of cushioning pads 40 that provide cushion to absorb impacts on the container to protect the wafers 22 from damage. Depending on the size of the stack of wafers 22 and the number of cushioning pads 40 selected, the container 20 may have more than enough capacity to contain the chosen number of wafers and cushioning pads. A spacer 41 (schematically illustrated) may be included to fill any remaining space within the container 20 that is not taken up by the stack of wafers 22 and the cushioning pads 40.

The cushioning pads 40 have oppositely facing contact surfaces that are adapted to contact the item adjacent to the corresponding side of the cushioning pad. In the example of FIG. 1, an uppermost cushioning pad 40 has a first contact surface 42 that is adapted to contact the underside (according to the drawing) of the spacer 41. A contact surface 44 is adapted to contact the wafer 22 at the top of the stack (according to the drawing). The contact surfaces 42 and 44 of each pad, of course, contact the adjacent item within the container, depending on the chosen order of stacking items. The lower most pad 40 (according to the drawing) includes a contact surface 44 that is received against the inside of the end wall 32 of the container bottom 30, for example.

At least one spring portion 46 extends between the contact surfaces 42 and 44 to resiliently maintain spacing between them. The spring portion 46 provides the desired amount of cushioning effect needed to protect the wafers 22 during shipping and handling, for example.

Figure 2:
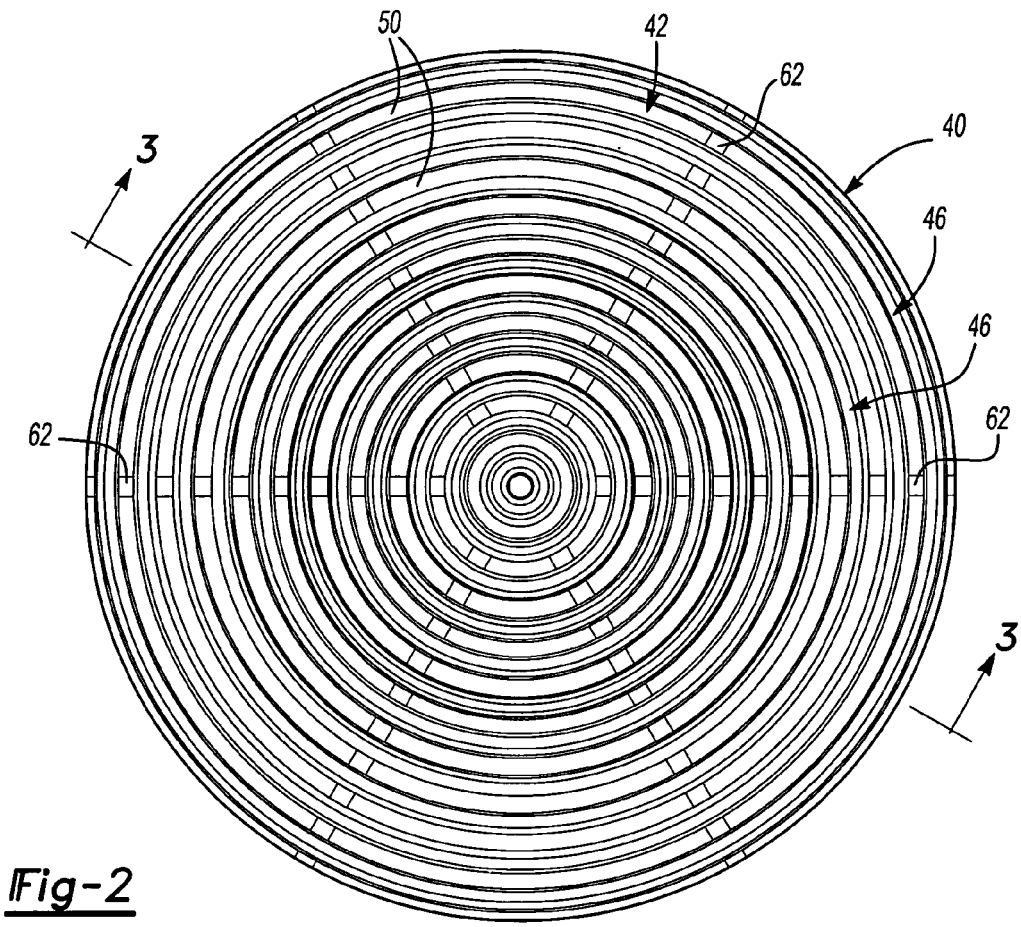
FIG. 2 is a planar view of an example embodiment of a cushioning pad designed according to this invention.
Figure 3:
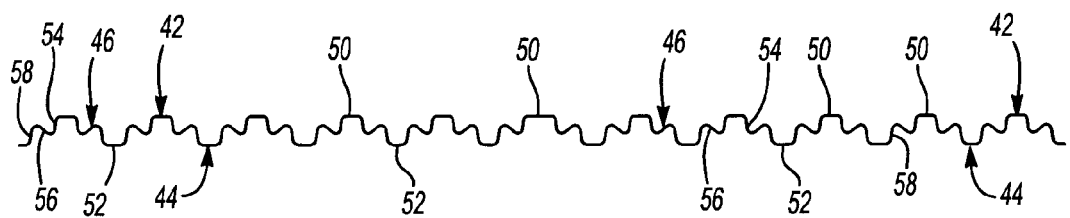
FIG. 3 is a cross-sectional illustration taken along the lines 3-3 in FIG. 2.
Figure 6:
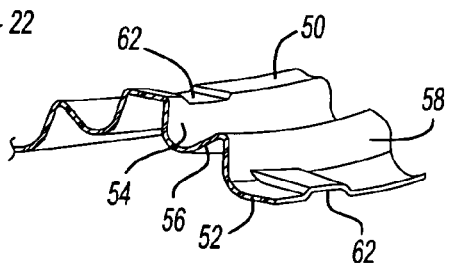
FIG. 6 schematically illustrates selected portions of the embodiment of FIG. 2 in perspective view.

As best appreciated from FIGS. 2, 3 and 6, the first contact surface 42 comprises a plurality of contact surfaces 50, which are concentric and circular in the illustrated example. Similarly, the second contact surface 44 comprises a plurality of concentric, circular contact surfaces 52. Spring portions 46 extend between adjacent, oppositely facing contact surfaces.

The spring portions 46 are plastic springs in one example where the entire cushioning pad 40 is made from a relatively thin film of plastic material. A variety of materials may be chosen to form the pad 40. In one example, a carbon-impregnated polystyrene material is used to ensure that the pads 40 do not introduce any adverse effects on the wafers 22, regardless of how long the wafers and pads are left within a container 20.

In one example, the pads 40 are vacuum formed using a selected plastic material. Depending on the characteristics of the chosen material, the thickness of the film will be selected to meet the needs of a particular situation. Given this description, those skilled in the art will be able to select from among commercially available materials and to choose the appropriate thickness and other pad dimensions to achieve the cushioning effect required for their particular situation.

The plastic spring portions 46 in the illustrated example include a first segment 54 extending away from the contact surfaces 50 toward the second contact surfaces 52. A second segment 56 extends away from the first segment 54 at an oblique angle. A third segment 58 extends away from the second segment 56 toward the second contact surfaces 52. The illustrated arrangement provides plastic springs between each adjacent, oppositely facing contact surface.

The illustrated example includes curvilinear transitions between the first, second and third segments of the plastic spring portions 46. These curvilinear transitions limit the direction of any movement between the contact surfaces 50 and 52 responsive to a compressive force on the pad 40. In one example, a compressive force in an axial direction results in purely axial movement of the contact surfaces relative to each other. In other words, the curvilinear transitions between the segments of the illustrated plastic spring portions ensure that no lateral deformation of the pad occurs responsive to a compressive force.

Figure 4:
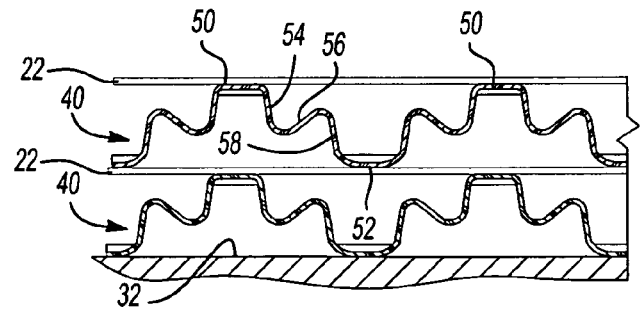
FIG. 4 schematically illustrates a selected portion of two cushioning pads designed according to the embodiment of FIG. 2 in a first condition.
Figure 5:
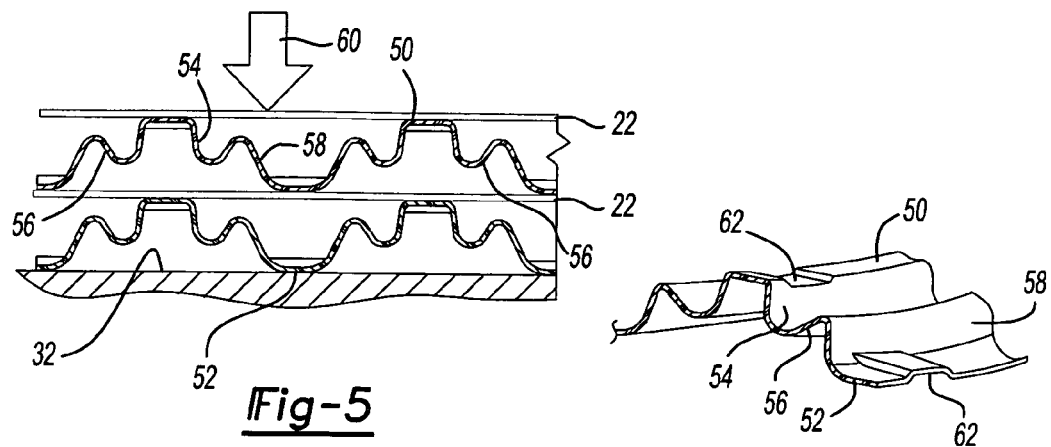
FIG. 5 illustrates the portions of FIG. 4 in a second condition where a compressive force is applied.

As best appreciated from FIGS. 4 and 5, an upper pad has the first contact surface 42, which includes the plurality of circular surfaces 50, received against a wafer 22. The second contact surface 44 includes the plurality of circular surfaces 52 that are received against another wafer on an opposite side of the upper pad 40 (according to the illustration). The lower pad 40 is received between the wafer 22 and the inside of the end wall 32 of the container bottom. FIG. 4 illustrates the selected portions of the arrangement in a first, packed condition.

FIG. 5 schematically illustrates a compressive force 60 that is applied to the combined stack of wafers 22 and cushioning pads 40. The design (i.e., thickness, material and length) of the plastic spring portions provides the desired amount of cushioning effect. FIG. 5 illustrates the flexing movement of the second segments 56 of the plastic spring portions 46 responsive to the compressive force 60. The distance between the contact surfaces 50 and 52 decreases only in an axial direction. There is no relative lateral movement between the contact surfaces and there is no lateral deformation of any portion of the cushion pad 40 even when subjected to the compressive force 60. The curvilinear transitions between the second segments 56 and the first and third segments 54 and 58, respectively, facilitate purely axial (i.e., vertical according to FIGS. 4 and 5) movement between the first and second contact surfaces of the cushion pad.

Another feature of the embodiment illustrated in FIGS. 2 and 6 is a plurality of recesses 62 on the contact surfaces. The recesses 62 interrupt what otherwise potentially could be a vacuum between the cushion 40 and an adjacent wafer 22. In the illustrated example, the recesses 62 are evenly distributed about the circular contact surfaces 50 and 52 in the pattern shown. At least one recess or vacuum-braking feature preferably is provided on each of the contact surfaces where concentric, circular contact surfaces are included on the pad 40. In one example, the recesses 62 are formed during the same vacuum forming process that establishes the overall configuration of the pad 40.

Figure 7:
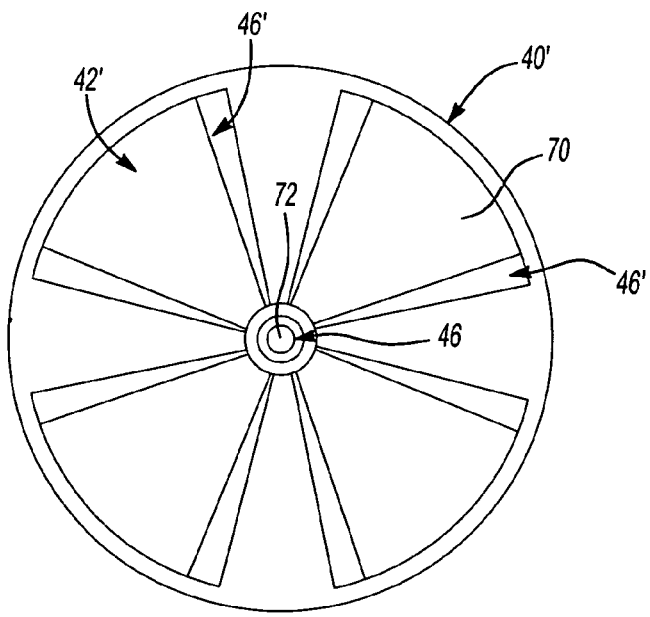
FIG. 7 schematically illustrates an alternative cushioning pad designed according to this invention.

FIG. 7 schematically illustrates another example pad 40'. In this example, the contact surface 42' comprises a plurality of wedge-like segments that are spaced about the pad 40'. A plurality of spring portions 46' are provided to establish the resiliency in a manner similar to that described for the previous example. In this example, a single circular contact surface 72 is provided at the center of the pad similar to the one provided at the center of the pad 40 of the embodiment of FIG. 2.

Figure 8:
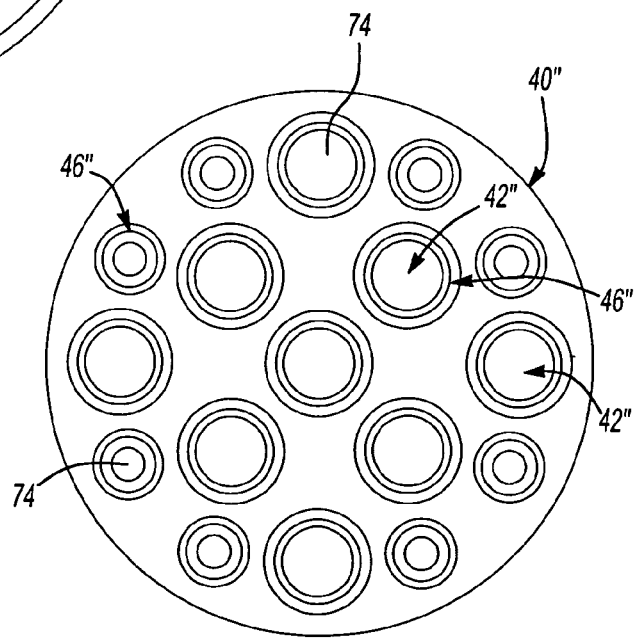
FIG. 8 schematically illustrates another alternative embodiment of a cushioning pad designed according to this invention.

FIG. 8 illustrates another example arrangement where a plurality of circular contact surfaces 74 are used to establish the contact surface 42" on one side of the cushion 40". The spring portions 46" in this example preferably are designed like the spring portions 46 in the example embodiment of FIG. 2.

As can be appreciated, a variety of configurations are within the scope of this invention. Those skilled in the art who have the benefit of this description will be able to select an appropriate configuration to meet the needs of their particular situation.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A pad for use in packaging items such as wafers, comprising:
    a first contact surface adapted to contact an item adjacent the pad;
    a second, oppositely facing contact surface; and
    at least one plastic spring portion resiliently maintaining a spacing between the first and second contact surfaces, wherein the first and second contact surfaces each comprise a plurality of circular surfaces and each of the circular surfaces includes a recessed portion extending across the surface.

2. The pad of claim 1, wherein the surfaces and the plastic spring portion are all formed from a single piece of plastic.

3. The pad of claim 2, wherein the plastic comprises carbon-impregnated polystyrene.

4. The pad of claim 1, wherein at least the first contact surface comprises a plurality of circular surfaces.

5. The pad of claim 1, wherein the circular surfaces are concentric.

6. The pad of claim 1, wherein the first and second contact surfaces are generally in parallel planes, and wherein the plastic spring portion comprises a first segment extending from the first contact surface toward the second contact surface, a second segment extending from the first segment in a direction that is generally parallel to the contact surface planes and a third segment extending from the second segment toward the second contact surface.

7. The pad of claim 6, wherein a transition between the second segment and each of the first and third segments is curvilinear.

8. The pad of claim 6, wherein the first and third segments are at oblique angles relative to the planes containing the contact surfaces.

9. The pad of claim 1, wherein the spacing between the first and second contact surfaces changes as the plastic spring portion flexes.

10. The pad of claim 1, wherein the plastic spring portion maintains a first spacing between the first and second contact surfaces and a second, smaller spacing responsive to a compressive force.

11. The pad of claim 10, wherein the plastic spring portion returns the first and second contact surfaces to the first spacing upon release of the compressive force.

12. A cushioning pad for use in packing items such as wafers, comprising:

a plastic film having a spring portion that resiliently establishes an operative thickness of the pad that is greater than a nominal thickness of the film, wherein the film is formed with oppositely facing contact surfaces that are adapted to contact an item adjacent to the pad and the spring portion extends between the contact surfaces, wherein the contact surfaces each include a plurality of circular surfaces and there is a spring portion associated with each of the circular surfaces, wherein the spring portions each comprise a first segment extending from a first one of the contact surfaces, a second segment extending from the first segment in a second direction and a third segment extending between the second segment and an adjacent, oppositely facing one of the contact surfaces.

13. The pad of claim 12, wherein the circular surfaces are concentrically arranged on the film and there is a spring portion between adjacent, oppositely facing ones of the circular surfaces.

14. The pad of claim 13, including at least one recess on the circular surfaces.

15. The pad of claim 12, including curved transitions between the segments of the spring portion.

16. The pad of claim 12, wherein the film comprises polystyrene.

17. The pad of claim 12, wherein the film comprises carbon-impregnated polystyrene.

18. The pad of claim 12, wherein the operative thickness varies responsive to a compressive force.

19. The pad of claim 12, wherein the spring portion flexes to vary the operative thickness.

20. The pad of claim 19, wherein the spring portion flexes to allow the operative thickness to be reduced responsive to a compressive force and the spring portion flexes to return the operative thickness to an initial thickness responsive to a release of the compressive force.

* * * * *